United States Patent [19]
Riggio, Jr.

[11] Patent Number: 5,543,791
[45] Date of Patent: Aug. 6, 1996

[54] NON-VOLATILE PARALLEL-TO-SERIAL CONVERTER SYSTEM UTILIZING THIN-FILM FLOATING-GATE, AMORPHOUS TRANSISTORS

[75] Inventor: Salvatore R. Riggio, Jr., Boca Raton, Fla.

[73] Assignee: International Business Machines, Armonk, N.Y.

[21] Appl. No.: 260,658

[22] Filed: Jun. 16, 1994

[51] Int. Cl.[6] .................................................. H03M 9/00
[52] U.S. Cl. .................. 341/101; 365/185.17; 365/219; 365/189.12; 377/79
[58] Field of Search .................................. 341/100, 101; 365/184, 185, 219; 377/74, 79; 257/315, 52

[56] References Cited

U.S. PATENT DOCUMENTS

| | | | |
|---|---|---|---|
| 4,460,978 | 7/1984 | Jiang et al. | 365/154 |
| 4,467,451 | 8/1984 | Moyer | 365/156 |
| 4,538,246 | 8/1985 | Wang et al. | 365/226 |
| 4,595,999 | 6/1986 | Betirac | 365/154 |
| 4,635,229 | 1/1987 | Okumura et al. | 365/154 |
| 5,452,250 | 9/1995 | Riggio, Jr. | 365/185 |

FOREIGN PATENT DOCUMENTS

0345058A2  6/1989  European Pat. Off. .

OTHER PUBLICATIONS

R. A. Street, "Amorphous Silicon electronics", pp. 70–75, MRS Bulletin, Nov. 1992.

M Shur and M. Tack, "Physics of amorphous silicon based allow field–effect transistors", J. App. Phys, 55(10), 15 May 1984, pp. 3831–3842.

Michael Shur, "Physics of semiconductor devices", Prentice Hall, 1990, pp. 437–446.

Arun Madan and Melvin P. Shaw, "The physics and applicatins of amorphous semiconductors", Academic Press 1988, chapters 2 and 3 (pp. 35–317).

*Primary Examiner*—Howard L. Williams
*Attorney, Agent, or Firm*—Martin J. McKinley; Douglas R. McKechnie

[57] ABSTRACT

A parallel-to-serial converter comprises a plurality of amorphous silicon thin-film transistors configured in a plurality of parallel-to-serial converter cells through which data is shifted through a plurality of amorphous silicon thin-film floating-gate transistors. In the event power is cutoff or lost, the floating gate transistors non-volatilely store the data which can be read when power is subsequently turned on. Each cell comprises two stages in which data signals are written before being input into the next stage and next cell. A clock generator receives clocking signals for controlling the shifting of data through the parallel-to-serial converter.

8 Claims, 4 Drawing Sheets

5,543,791

1

NON-VOLATILE PARALLEL-TO-SERIAL CONVERTER SYSTEM UTILIZING THIN-FILM FLOATING-GATE, AMORPHOUS TRANSISTORS

CROSS REFERENCES TO RELATED APPLICATIONS

The following applications, all assigned to the assignee of this application, are related:

(1) application Ser. No. 08/260,941, filed concurrently herewith, for "A NON-VOLATILE MEMORY SYSTEM UTILIZING THIN-FILM, FLOATING-GATE, AMORPHOUS TRANSISTORS" by Salvatore R. Riggio, Jr.

(2) application Ser. No. 08/261,352, filed concurrently herewith, for "A NON-VOLATILE SERIAL-TO-PARALLEL CONVERTER SYSTEM UTILIZING THIN-FILM, FLOATING-GATE, AMORPHOUS TRANSISTORS" by Salvatore R Riggio, Jr.

(3) application Ser. No. 08/261,356, filed concurrently herewith, for "A NON-VOLATILE REGISTER SYSTEM UTILIZING THIN-FILM FLOATING-GATE AMORPHOUS TRANSISTORS" by Salvatore R. Riggio, Jr., now U.S. Pat. No. 5,452,250.

BACKGROUND OF THE INVENTION

1. Field of the Invention

This invention relates to the field of data processing, and, more particularly, to an improved non-volatile parallel-to-serial converter having amorphous silicon thin-film floating-gate transistors that non-volatilely store data in the event power is turned off or lost.

2. Description of Related Art

Amorphous thin-film transistors provide a technology that is advantageous for large area, low cost integrated circuits. One type of such transistors has a floating gate that can be used to provide non-volatile storage of data. There are many different devices commonly used in digital circuits which temporarily store data and wherein the data is lost when power is turned off and in the event of a power failure. A parallel-to-serial converter is an example of such a device. The invention is directed to an improved parallel-to-serial converter in which amorphous silicon thin-film floating-gate transistors are used to buffer or temporarily store data while power is turned on and to non-volatilely store data in the event power is lost or turned off. Such preservation of the data may advantageously be used for diagnostic, start-up, and resume operations.

It is recognized that floating gate transistors have been implemented using crystalline semiconductor material. Such transistors are operated by injecting a charge onto the floating gate by means of an avalanche breakdown of the insulator surrounding the floating gate. Such transistors find use in erasable programmable read only memories (EPROM) where the injected charge can be non-volatilely stored for long periods of time when power is off. However, a crystalline floating gate transistor has limited uses since it requires a relatively long period of time to erase the charge and reprogram the transistor, and the insulator has a limited life due to the deleterious effect of the avalanche breakdown.

SUMMARY OF THE INVENTION

One of the objects of the invention is to provide an improved parallel-to-serial converter in which amorphous silicon thin-film floating-gate transistors are used to buffer or temporarily store data while the parallel-to-serial converter is being operated and to non-volatilely store data in the event power is lost or turned off.

A further object of the invention is to provide an improved parallel-to-serial converter in which amorphous silicon thin-film floating-gate transistors are used to buffer or temporarily store data as the data is shifted through the parallel-to-serial converter and to non-volatilely store data in the event power is lost or turned off.

Another object of the invention is to provide an improved integrated circuit parallel-to-serial converter in which amorphous silicon thin-film transistors are used throughout the parallel-to-serial converter.

Briefly, in accordance with the invention, a parallel-to-serial converter comprises a plurality of amorphous thin-film transistors configured in a plurality of parallel-to-serial converter cells in which data is shifted between amorphous thin-film floating-gate transistors. In the event power is cutoff or lost, the floating gate transistors non-volatilely store the data so that such data can be recovered or restored when power is subsequently turned on.

BRIEF DESCRIPTION OF THE DRAWINGS

Other objects and advantages of the invention will be apparent from the following description taken in connection with the accompanying drawings wherein.

DESCRIPTION OF ILLUSTRATIVE EMBODIMENT

Figure 1:
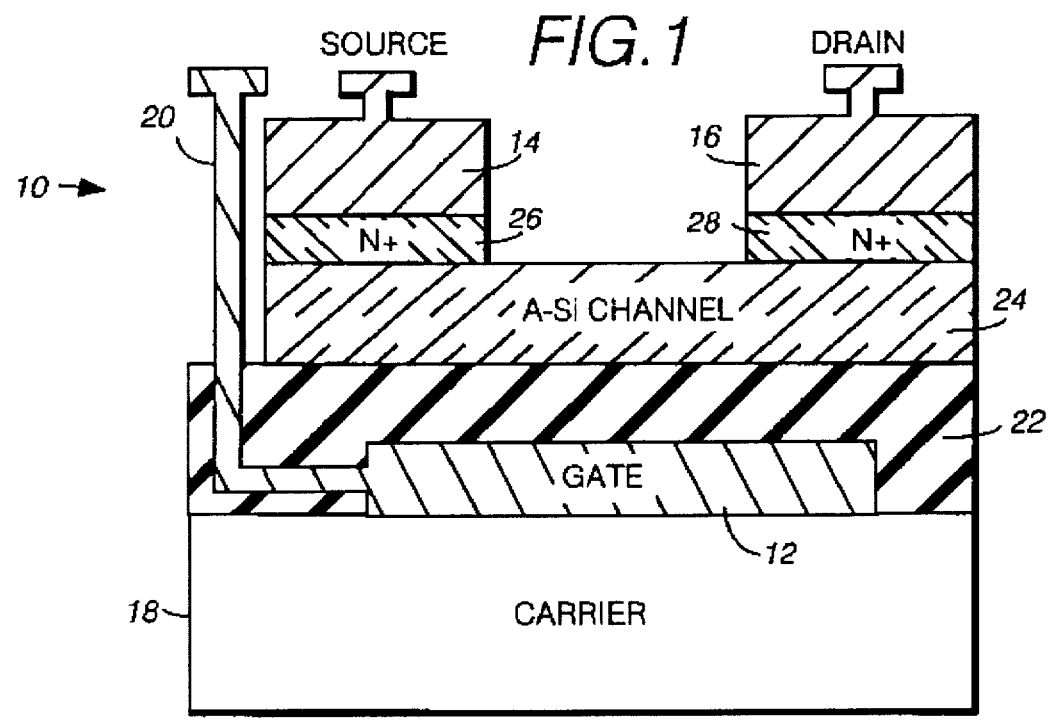
FIG. 1 is a schematic diagram of an amorphous silicon thin-film transistor used in the invention.

Referring now to the drawings, FIG. 1 schematically shows a basic transistor 10 which is a three terminal, amorphous-silicon (A-Si) thin-film field effect transistor 10 having a gate 12, a source 14, and a drain 16. Gate 12 is made of aluminum deposited on a non-conductive carrier 18. A layer 22 of insulating material covers gate 12, and a thin film A-Si N-channel 24 is deposited on layer 22. An N-channel is a channel through the A-Si in which the majority carriers are electrons. The upper portions of source 14 and rain 16 are formed of aluminum and form contacts or terminals to which other metal lines can be joined allowing the transistor to be integrated into a circuit, the upper portions being deposited on ohmic contacts 26 and 28. These ohmic contacts in turn are deposited at spaced positions on channel 24. Contacts 26 and 28 are preferably formed of N-type semiconductor material. Gate 12 also includes a terminal portion 20 that extends through insulating layer 22. During operation, the presence of a positive (relative to the source) voltage on the gate creates an electric field that causes channel 24 to be conductive allowing current to flow between the source and drain. Basic transistor 10 is used for a variety of configurations and functions including current limiting devices, inverters, source followers, electronic switches, and analog switches, as described in more detail below. A-Si thin film transistors can be deposited on a variety of substrate materials, such as glass, quartz or plastic. The substrate material can be either rigid or flexible, and can be comparatively large (for example, 8" by 8"). The construction of thin film transistors is well known in the art. (See, for example, Nick Hall, Jr., Prentice Hall Series In Solid State Physical Electronics, pp 437–446, Prentice Hall, 1990).

Figure 2:
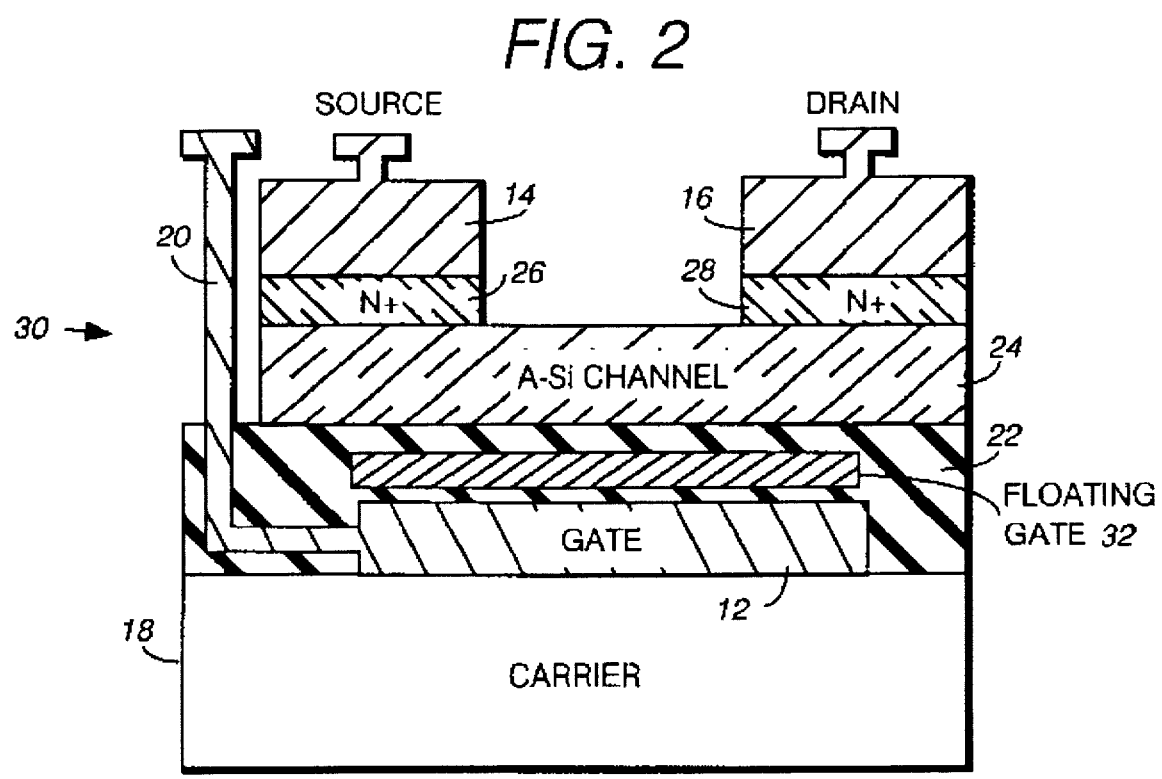
FIG. 2 is a schematic diagram of an amorphous silicon thin-film floating-gate transistor used in the invention.

With reference to FIG. 2, there is shown an amorphous-silicon (A-Si) thin-film floating-gate field-effect transistor 30 that is referred to in the specification and claims simply as a "floating gate" transistor to distinguish it from a "basic" transistor 10. Transistor 30 has a structure similar to that of transistor 10 except for the addition of a floating gate 32 that is fully enclosed or embedded in insulator 22 between a control gate 31 and channel 24. The floating gate 32 is closer to control gate 31 than it is to either the drain or the source and is capacitively coupled with the control gate, the gate, and the source to form three parallel plate capacitors. Transistor 30 is used as a data storage device where the capacitive charging of these capacitors controls the conduction of the channel and represents a bit of information, in the manner described hereinafter. Insulator 22 has a high resistivity against leakage current so that the capacitors can retain a charge for long periods of time when power is off. An insulator made of silicon nitride or polystyrene retains a charge for a period of at least six months. Transistor 30 is also fabricated using the thin film process described above. When a positive voltage of level +Vdd is applied to control gate 31, channel 24 becomes conductive, and when a negative voltage of level −Vss is applied to gate 12, channel 24 becomes non-conductive.

Figure 3:
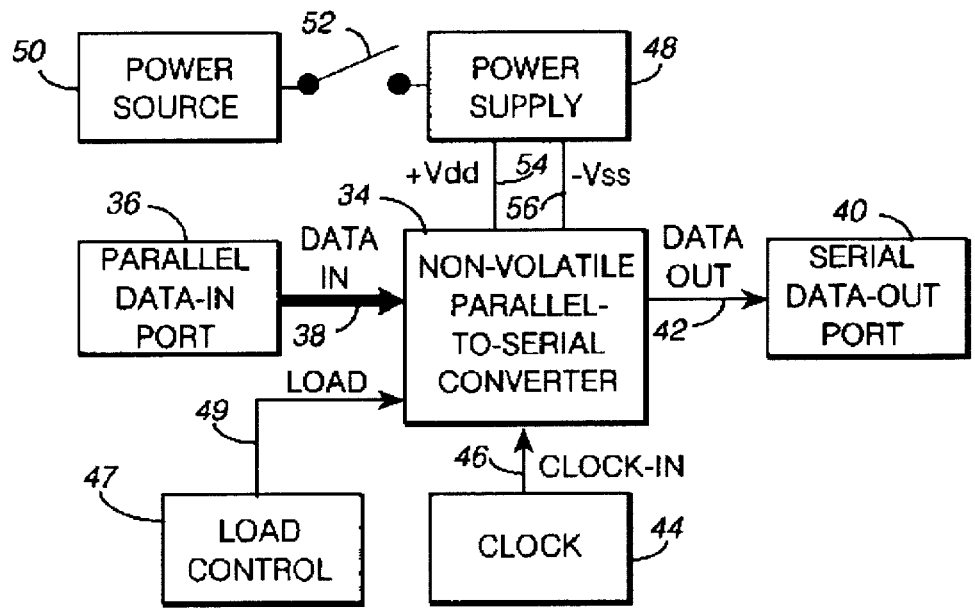
FIG. 3 is a block diagram of a portion of a data processing system that embodies the invention.

Referring to FIG. 3, a non-volatile parallel-to-serial converter 34 is part of a data processing system that also includes a parallel data-in port 36, a serial data-out port 40, a power source 50, ON-OFF switch 52, a load control 47, a power supply 48, and a clock 44. Port 36 is a source of parallel data that are supplied as DATA-IN signals on an input bus 38 having data lines 38-1 to 38-n for transmitting "n" data bits in parallel. Port 40 is connected to the output of parallel-to-serial converter 34 by line 42 and receives DATA-OUT signals. Load control 47 is selectively operated to generate a LOAD signal on line 49 for causing data from port 36 to be written or loaded into converter 34. Clock 44 is selectively operated to generate CLOCK-IN signals that are transmitted over line 46 into parallel-to-serial converter 34 for loading data into, shifting the data in, and reading the data from the converter.

Power source 50 can be either or both of an AC power source or a DC power source such as from a battery or a converter. Switch 52 is selectively actuated and, when closed, connects power source 50 to power supply 48 which, in response, supplies +Vdd and −Vss voltages to parallel-to-serial converter 34 over voltage supply lines 54 and 56. The data in converter 34 is stored in a non-volatile manner during periods in which power source 50 is turned off, disconnected, or fails. The data thus stored can be recovered by operating clock 44 to read the data out of the parallel-to-serial converter, once power is turned on.

Figure 4:
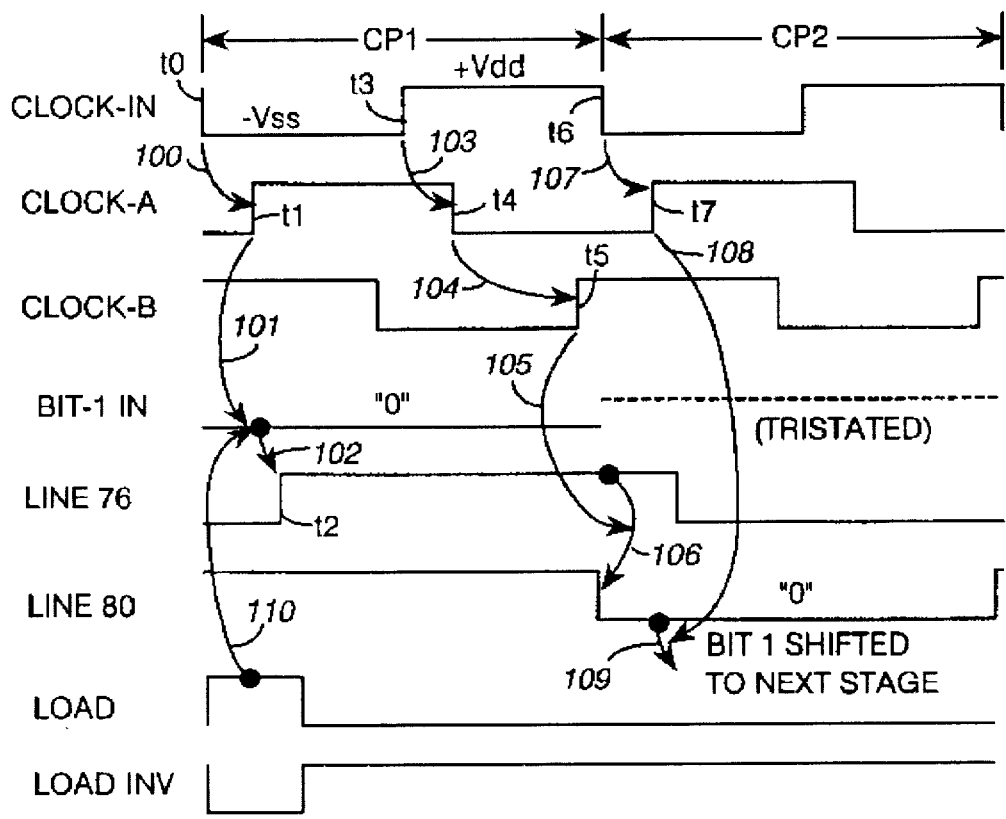
FIG. 4 is a timing diagram of various signals generated during the course of operation of the invention.

As shown in FIG. 4, the CLOCK-IN signal is a train of periodic, equal width pulses having a 1-millisecond clock period (CP). The magnitude of the signals shown in FIG. 4. vary between +Vdd and −Vss voltages that represent the high and low signal levels. Exemplary voltage levels for +Vdd and −Vss are ±30-volts, which levels can be readily converted to a standard five-volt logic level for use with circuits requiring such standard logic level. The DATA-IN signals are driven in synchronization with the CLOCK-IN signal so that the data is stable when the CLOCK-IN signal goes positive. The DATA-IN signal uses a −Vss voltage to represent a "0" bit and a +Vdd to represent a "1" bit. The remaining signals are described below with reference to details of the circuit diagram shown in FIG. 5.

Figure 5A:
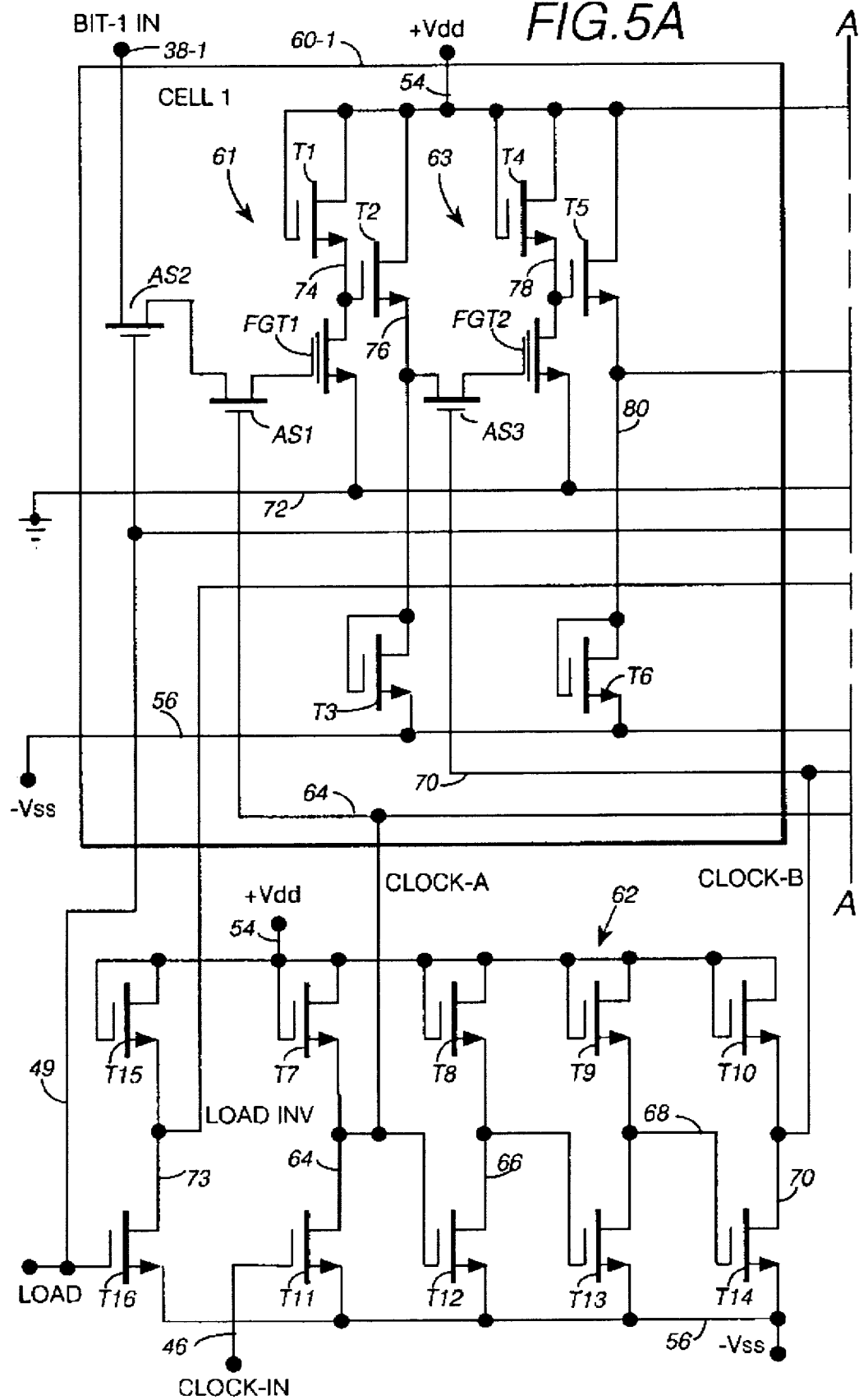
FIGS. 5A and 5B, when joined along reference lines A—A, form a schematic circuit diagram of the parallel-to-serial converter shown in FIG. 4.
Figure 5B:
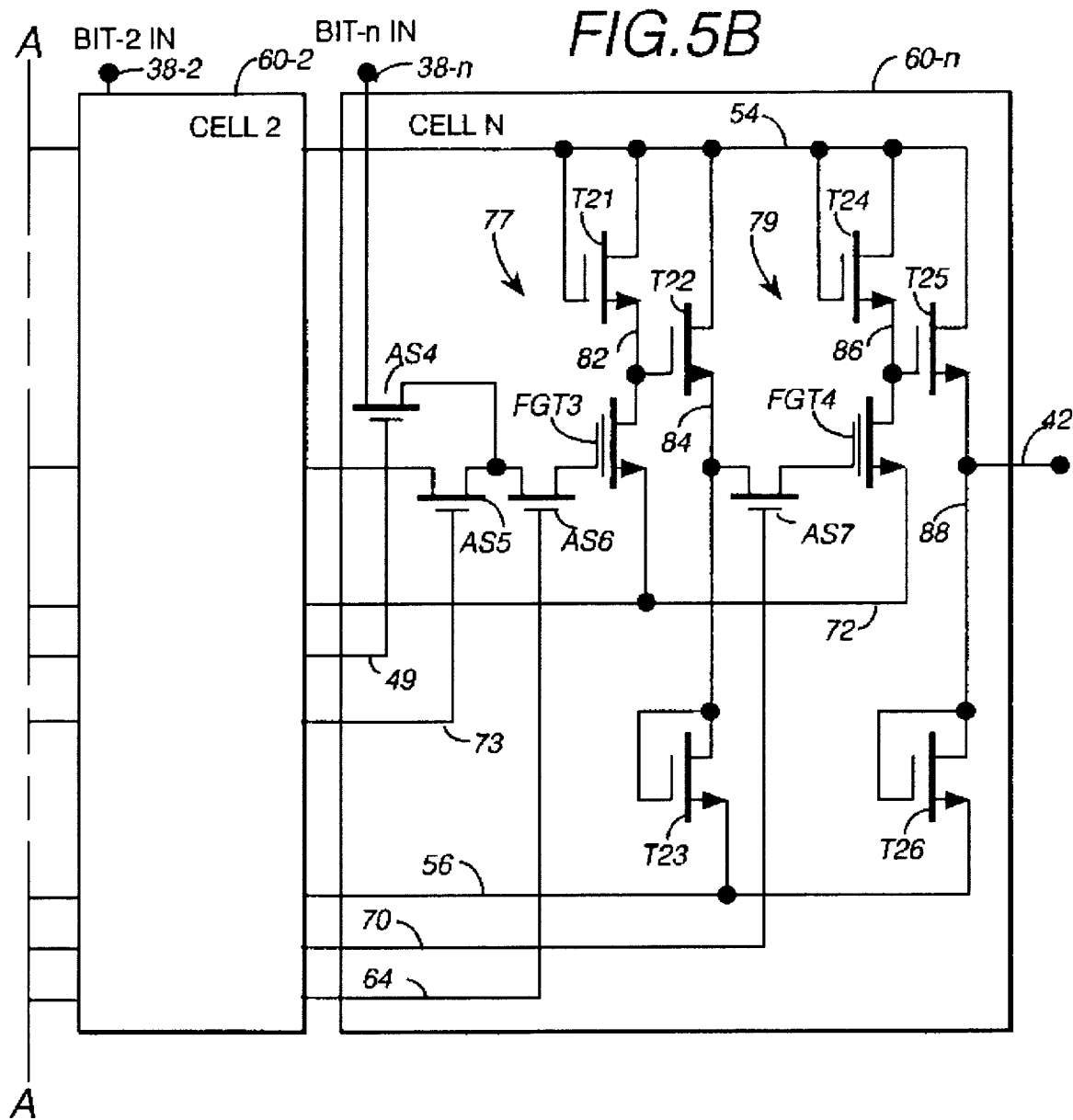
Figure 5C:
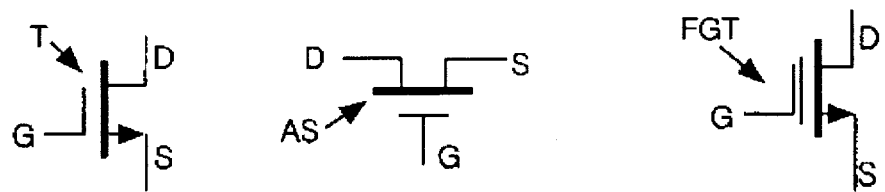
FIG. 5C illustrates various symbols used in FIGS. 5A and 5B to represent different transistor devices.

FIG. 5C illustrates different transistor symbols used in FIGS. 5A and 5B to represent a basic transistor T, an analog switch AS, and a floating gate transistor FGT. The gates, control gates, drains and sources are indicated in FIG. 5C by the letters "G", "CG", "D", and "S" but such letters have been omitted from FIGS. 5A and 5B to avoid cluttering.

With reference to FIGS. 5A and 5B, parallel-to-serial converter 34 is preferably formed as an integrated circuit in which the various amorphous transistors are created on a common carrier, the transistors being interconnected or coupled by metallization lines that carry the signals. Parallel-to-serial converter 34 comprises "n" dual-stage, converter cells 60-1 to 60-n, and a clock generator 62. The number "n" of cells is a matter of choice dependent upon the particular purpose or application. Typically, parallel-to-serial converter 34 has eight, sixteen, or thirty two cells for storing a like number of bits.

Clock generator 62 provides data shifting or timing signals concurrently to all of converter cells 60, as follows. Clock generator 62 receives a CLOCK-IN signal on line 46 and generates in response thereto a CLOCK-A signal and a CLOCK-B signal. As described in more detail below, CLOCK-A signals are used to shift data into and between the cells while CLOCK-B signals are used shift data between stages of the cells. Generator 62 comprises four transistors T11, T12, T13, and T14 that form switches connected in parallel between voltage lines 54 and 56. Transistors T11–T14 are conductive when the gate voltages are positive or high and non-conductive when the gate voltages are negative or low. Four transistors T7–T10 are respectively connected in series with transistors T11–T14 and in parallel with each other between voltage lines 54 and 56. Transistors T7–T10 have their gates and drains connected in common to thereby act load devices for limiting the flow of current through the transistor switches. With such configuration, switches T11–T14 act as inverters that operate with predetermined circuit delays. For example, when the gate of T11 is high, T11 conducts so that the source thereof and line 64 are tied to −Vss with a negligible voltage drop through T11. The signal on line 64 is inverted relative to the gate signal after a short circuit delay.

A line 64 interconnects the drain of T11, the source of T7, the gate of T12 and the gate of AS1 and transmits the CLOCK-A signal therebetween. Line 64 also carries the CLOCK-A signal to all corresponding ASs of the other cells. The switching action of T11 causes CLOCK-A to be inverted at the end of a predetermined circuit delay time after the CLOCK-IN signal changes. Relative to the timing signals in FIG. 4, the CLOCK-A signal is generated as follows. Starting just prior to time t0, when CLOCK-IN is high, T11 is conductive or on, and line 64 is coupled to low (inverted relative to the high gate input). When CLOCK-IN goes low at time t0, switch T11 becomes non-conductive thereby decoupling line 64 from line 56 causing line 64 to go high at time t1 after a short circuit delay. Subsequently, when CLOCK-IN goes positive at t2, CLOCK-A goes low at t3.

The positive going signal of CLOCK-A at t1 is applied to the gate of switch T12 thereby switching T12 from a non-conductive state to a conductive state and causing the voltage on line 66 to go negative. Line 66 is connected between the drain of T12, the source of T8, and the gate of T13. When line 66 goes negative, switch T13 becomes non-conductive thereby causing the voltage on line 68 to go positive. Line 68 is connected to the drain of T13, the source of T9, and the gate of T14. When line 68 goes positive, switch T14 is turned off thereby causing the voltage on line 70 to go negative. The voltage on line 70 is the CLOCK-B signal that is transmitted to the gate of AS3 and to the corresponding ASs in each of the converter cells. The switching action of switches T12–T14 introduce three circuit delays before CLOCK- B changes relative to CLOCK-A. The switching of CLOCK-B occurs four circuit delays after CLOCK-IN changes. The circuit delays are short enough to occur within one-half of a clock period so that CLOCK-B falls at time t4 and before CLOCK-IN rises at time t2. When CLOCK-IN rises at t2, the actuation of the transistor switches reverses relative to the operation just described. Thus, in response to CLOCK-IN going positive at t2, switch T11 is turned on and CLOCK-A goes negative at t3. This causes T12 to be turned off, T13 to be turned on, and T14 to be turned off causing CLOCK-B to go positive at time t5. It should be thus apparent that CLOCK-A inversely follows CLOCK-IN with one delay time, and CLOCK-B inversely follows CLOCK-A with three delay times while directly following CLOCK-IN with four delay times.

A transistor switch T16 is connected in series with a load device T15 across voltage supply lines 54 and 56. The gate of T16 is connected to line 49 for receiving the LOAD signal. Line 73 is connected between the source of T15 and the drain of T16 and transmits a LOAD INV signal that is inverted relative to the LOAD signal. Line 49 is further connected to the gate of AS2 to control the conduction thereof, and to the gates of the ASs in the remaining cells corresponding to AS2. When the LOAD signal is high, AS2 becomes conductive causing the BIT-1 IN signal on bus line 36-1 to be coupled to the drain of AS1. By simultaneously applying an active CLOCK-A signal to the gate of AS1, the BIT-1 IN signal is transmitted to the control gate of FGT1 causing the data signal to charge FGT1 and render it conductive for a positive signal and non-conductive for a negative signal.

Cell 60-1 comprises two stages 61 and 63 that operate under the control of CLOCK-A and CLOCK-B signals respectively. Stage 61 is the first or input stage of cell 60-1 and comprises AS1, FGT1, T1, T2 and T3. The drain and source of switch AS1 are connected to data input line 38 and to the gate of FGT1. When the gate of AS1 goes positive, the channel of AS1 becomes conductive and the voltage signal applied to the control gate of FGT1 follows the data input signal and swings positive or negative in accordance therewith. When AS1 is subsequently turned off, the control gate of FGT is isolated and the floating gate of FGT1 retains a charge that is either positive of negative, relative to the source and drain, in accordance with the level of the DATA-IN signal at the time AS1 is turned off.

The source of FGT1 is coupled with a ground line 72, while the drain of FGT1 is coupled by line 74 to the source of transistor T1 and to the gate of transistor T2. Ground line 72 provides a center reference point. The gate and drain of transistor T1 are connected in common to voltage supply line 54 and receive +Vdd voltage. Transistor T1 is thus configured as a load device for limiting current flow through the drain, channel, and source of FGT1. When FGT1 is conductive, line 74 is pulled down to ground whereas line 74 is pulled up to +Vdd when FGT1 is non-conductive. Transistor T2 is configured or connected as a source follower to shift voltage levels between lines 74 and 76. The drain of transistor T2 is connected to line 54 and is at +Vdd while its source is connected by line 76 to the drain of AS2 and to the drain and gate of transistor T3. The source of T3 is connected to line 56 and is at −Vss. T3 is thus connected as a load device to the source of T2. The voltage on line 74 is above the voltage on line 76 by a relatively constant amount producing a voltage level shift thereby allowing the voltage applied to AS2 to be either positive or negative dependent on whether FGT1 is on or off. If FGT1 is off, the voltage applied to AS2 is positive, and if FGT1 is on, the voltage applied to AS2 is negative.

Stage 63 is the second or output stage of cell 60-1 and comprises AS3, FGT2, T4, T5, and T6 which are identical to AS1, FGT1, T1, T2, and T3, with line 76 acting as the data input line into stage 63 and with AS3 being controlled by the CLOCK-B signal on line 70. Line 80 forms the data-out line from stage 63 and cell 60-1. Line 80 also is the data-in line for shifting data into the next cell 60-2.

Further operation of parallel-to-serial converter cell 1 will now be explained relative to FIG. 4 using an example of writing a "0" BIT-1 IN into the converter during one period and shifting the bit into the next cell during the next clock period. The LOAD signal is driven active at time t0 also thereby switching AS2 on to couple the BIT-1 IN signal to the drain of AS1. In response to the CLOCK-IN signal going negative at time t0, transistor T11 inverts the signal and drives CLOCK-A positive (as indicated by arrow 100) at time t1. In response to CLOCK-A going positive at time t1, switch AS1 becomes conductive (arrow 101) causing BIT-1 IN signal t to be inputted into the first stage 61 of cell 60-1. The output line 76 of 61 stage transmits (as indicated by arrow 102) a voltage signal at t2 indicative of such bit. During such operation, the control gate of FGT1 receives a negative BIT-1 IN signal representing the "0" bit, which causes FGT1 to become non-conductive, and line 74 is pulled up high causing line 76 to go positive at time t2. In other words, the BIT-1 IN signal is transferred and inverted from the input data line 38-1 to line 76. When the LOAD signal falls, AS2 becomes non-conductive thereby decoupling or disconnecting the control gate of FGT1 from the BIT-1 IN signal. The "0" data bit is thus written or stored in FGT1 for the remainder of period CP1 and the signal on line 76 provides the output signal, from stage 61, which is high and represents the "0" bit.

At this point, further discussion of the theory of operation of A-Si amorphous FGTs may provide a better understanding of the invention. As indicated previously relative to FIG. 2, FGT 30 has three capacitors formed by the capacitive coupling between control gate 31 and floating gate 32, between source 14 and floating gate 32, and between drain 16 and floating gate 32. The floating gate is common to all three capacitors. The field effect due to the voltage between floating gate 32 and source 14 determines if channel 24 is conductive or not. However, the two capacitors (control gate/floating gate and floating gate/source) are in series and act as a voltage divider. Since the floating gate is closer to the control gate than to the source, there is a greater capacitance and hence a lesser voltage drop across the control gate/floating gate capacitor. Thus, in order to develop the necessary voltage between the floating gate and the source for controlling conductivity, it is necessary to apply a relative high voltage (±30-volts) since the voltage drop, occurring between the control gate and the floating gate, is lost or not available for directly controlling conductivity. The data signal applied to control gate 31 causes current to flow and charge the capacitors The capacitors remain charged when AS1 opens due to the isolation of the control gate and the high resistance in all directions and the fact there is no low impedance leakage path. In contrast to floating gate transistors formed with crystalline semiconductor material, the A-Si FGTs used in the invention operate using a capacitive charge transference and do not use breakdown voltages and avalanche breakthroughs of the insulator surrounding the floating gate.

When AS1 is turned off at t4, AS2 is off. In response to CLOCK-A going low at t4, CLOCK-B subsequently goes high at t5 (arrow 104) and such signal turns AS3 on (arrow 105) thereby transferring (arrow 106) the first bit from input stage 61 into output stage 63 of cell 60-1. During the transfer, the positive signal on line 76 drives the control gate of FGT2 positive to thereby turn FGT2 on causing line 78 to go low and drive line 80 negative. This negative signal represents the "0" bit at the output of stage 63 and cell 60-1.

At the beginning of period CP2, CLOCK-IN goes low at t6 causing (arrow 107) CLOCK-A to go high at t7. It is to be recalled that the CLOCK-A and CLOCK-B signals are transmitted to each of the cells of the parallel-to-serial converter, so that the CLOCK-A signal causes (arrow 108) the BIT-1 IN to be transferred from cell 60-1 into the first stage of cell 60-2. This first bit is then propagated through the remaining cells of converter 34 during subsequent clock periods in the same manner at it was through cell 60-1. At the end of "n" clock periods, the first bit is stored in cell 60-n, which is the last cell in the series. Should power be lost at any time, the data bits stored in the FGTs will remain for a period of many months in the event power is not restored. When power is restored, the data in converter 34 can be recovered by operating clock 44 to read out the data serially into port 40.

With reference to FIG. 5B, cell 60-n comprises two stages 77 and 79. Stage 79 is identical to the second stage 63 and comprises AS7, FGT4, T24, T25, T26, and line 88 that respectively correspond to AS3, FGT2, R4, T5, T6, and line 80, except that line 80 is connected to or forms part of converter output line 42 over which data is serially transferred from the converter. Stage 77 is similar of stage 61 and includes AS4, AS6, FGT3, T21, T22, T23, and line 84 which respectively correspond to AS2, AS1, FGT1, T1, T2, T3, and line 76, but stage 77 further includes a switch AS5 that has its gate connected to line 73 operate under the control of the LOAD INV signal to allow the BIT-n IN to be written into cell 60-n during the first clock period CP1 and to shift the data bit from the preceding stage into cell 60-n during subsequent shifting periods. AS5 has its drain connected to the output line of the previous cell and its source connected to the drain of AS6. Obviously, AS4 and AS5 are conductive at different times.

Each cell between 60-1 and 60-n has a first stage identical to the first stage 77 of cell 60-n and a second stage identical to the second stage 63 of cell 60-1, whereby the data is written into such cells in parallel during the first clock period and is shifted between cells in subsequent periods, in the same manner as described above.

It should be apparent to those skilled in the art that many changes can be made in the details and arrangements of steps and parts without departing from the scope of the invention as defined in the appended claims.

What is claimed is:

1. An electrically operated parallel-to-serial converter system adapted to receive power from a power source, said parallel-to-serial converter system comprising:

a data source for supplying parallel data bit signals;

a parallel-to-serial converter connected to said data source for receiving data therefrom;

a data sink connected to said parallel-to-serial converter for receiving serial data therefrom;

a selectively operated power supply adapted to be connected to the power source, for supplying power to said parallel-to-serial converter when said power supply is turned on;

said converter having a plurality of cells, each of said cells comprising first and second stages, each stage comprising
a thin-film amorphous floating-gate transistor (FGT) including a control gate, a drain, a source, a channel extending between said drain and said source, an insulator between said control gate and said channel, and a floating gate embedded in said insulator, said channel being conductive when a voltage signal of a first polarity is applied between said control gate and said source and non-conductive when a voltage signal of a polarity opposite to said first polarity is applied between said control gate and said source,
a data-in line,
a data-out line, and
a first analog switch (AS) comprising a thin-film amorphous transistor having a gate for turning said analog switch on and off in response to switching signals applied thereto, and a drain and a source connected between said data-in line and said control gate of said FGT for coupling a data bit signal on said data-in line to said control gate when said AS is turned on to thereby capacitively charge said floating gate to represent such data bit;

each cell having the data-out line of its first stage coupled to the data-in line of its second stage;

means connecting said cells in series with each data-out line from the second stage of a previous cell being connected to the data-in line of the first stage of the next cell whereby said first timing pulse shifts data bits between the cells;

a switching pulse generator connected to said first AS of each first stage of cell, for supplying a first switching pulse to said first ASs of all of said first stages to write data bits into said first stages and a second switching pulse to said first ASs of all of said second stages to transfer the data bits in each of said first stages into each of said second stages; and said FGTs of said parallel-to-serial converter cells being operative to non-volatilely store data bits when said power supply ceases to supply power to said parallel-to-serial converter.

2. A parallel-to-serial converter system in accordance with claim 1, wherein:

said data source comprises a data bus having a plurality of data lines corresponding to the number of cells in the converter;

each first stage of each cell further comprising a second AS connected between said first AS in such stage and one of said data lines for coupling a data bit signal on such line to said first AS when said second AS is conductive;

and load control means connected to each of said second ASs for supplying a LOAD signal to turn on said second ASs and write data into said converter.

3. A parallel-to-serial converter system in accordance with claim 2, comprising:

first and second voltage supply lines connected to said power supply for providing first and second voltages of opposite polarity;

each stage further comprises a first load device connected between said first voltage supply line and said FGT in such stage, for limiting current in said FGT when such FGT is conductive, a source follower coupled to said FGT and said data-out line, and a second load device connected between said source follower and said second voltage supply line for limiting current through said source follower.

4. A parallel-to-serial converter system in accordance with claim 2, comprising:

first and second voltage supply lines connected to said power supply for providing first and second voltages of opposite polarity;

each stage further comprises a first load device connected between said first voltage supply line and said drain of said FGT in such stage, for limiting current in said FGT when such FGT is conductive, a source follower having a gate coupled to said drain of said FGT, a drain coupled to said first voltage supply line, and a source coupled with said data-out line, and a second load device connected between said source of said source follower and said second voltage supply line for limiting current through said source follower; and said source follower being operative to generate a data signal on said data-out line which is of a polarity opposite to the polarity of a data bit signal on said data-in line of the stage.

5. A parallel-to-serial converter system in accordance with claim 2, wherein:

said converter has "n" cells; and said clock generates "n" clock pulses for reading "n" data bits from said converter.

6. An electrically operated parallel-to-serial converter system adapted to receive power from a power source, said parallel-to-serial converter system comprising:

a selectively operated power supply adapted to be connected to the power source for supplying positive and negative voltages;

a clock for generating a series of clock pulses;

a data source for supplying a plurality of data bit signals in parallel;

a data sink for receiving serial data;

a parallel-to-serial converter having an input bus coupled to said data source for receiving said data bit signals and an output line coupled to said data sink, said parallel-to-serial converter being coupled to said power supply and further comprising a first bus for receiving a positive voltage from said power supply and a second bus for receiving a negative voltage from said power supply, said converter further comprising a plurality of converter cells and a clock generator;

each of said cells comprising first and second stages, each stage comprising a thin-film amorphous silicon (A-Si) floating-gate transistor (FGT) including a control gate, a drain, a source, an N- channel extending between said drain and said source, an insulator between said control gate and said N-channel, and a floating gate embedded in said insulator, said channel being conductive when a positive voltage signal is applied between said control gate and said source and non-conductive when a negative voltage signal is applied between said control gate and said source, a data-in line, a data-out line, an analog switch (AS) comprising an N-type thin-film A-Si transistor having a gate for turning said analog switch on and off in response to switching signals applied thereto, and a drain and a source connected between said data-in line and said control gate of said FGT for coupling a data bit signal on said data-in line to said control gate when said AS is turned on to thereby capacitively charge said floating gate to represent such data bit, a first load device connected between said first bus and said drain of said FGT in such stage, for limiting current in said FGT when such FGT is conductive, a source follower having a gate coupled to said drain of said FGT, a drain coupled to said first bus, and a source coupled with said data-out line, a second load device connected between said source of said source follower and said second bus for limiting current through said source follower, and said source follower being operative to generate a data signal on said data-out line which is of a polarity opposite to the polarity of a data bit signal on said data-in line of the stage;

each cell having the data-out line of its first stage coupled to the data-in line of its second stage;

each preceding cell having the data-out line of its second stage coupled to the data-in line of the first stage of the next cell;

said clock generator being connected to each AS of each parallel-to-serial converter cell, for supplying a first switching pulse to said ASs of all of said first stages to thereby write data bits into said first stages and a second switching pulse to said ASs of all of said second stages to transfer the data bits in each of said first stages into each of said second stages; and said FGTs of said parallel-to-serial converter cells being operative to non-volatilely store data bits when said power supply ceases to supply power to said parallel-to-serial converter.

7. A parallel-to-serial converter system in accordance with claim 6, wherein:

said converter has "n" cells; and said clock generates "n" clock pulses for reading "n" data bits from said converter.

8. A parallel-to-serial converter system in accordance with claim 7, comprising:

a plurality of analog switches connected respectively to said data in lines of said second stages;

a data in bus coupling the last mentioned analog switches to said data source; and a load control connected to said last mentioned analog switches and operative to generate a LOAD signal for writing data into said converter from said data sink.

* * * * *